United States Patent
Huang et al.

(10) Patent No.: US 8,525,571 B2
(45) Date of Patent: Sep. 3, 2013

(54) VOLTAGE AMPLITUDE LIMITING CIRCUIT OF FULL DIFFERENTIAL CIRCUIT

(75) Inventors: Chih Ying Huang, Taipei (TW); Wen Lung Shieh, Taipei (TW)

(73) Assignee: C-Media Electronics Inc., Taipei (TW)

( * ) Notice: Subject to any disclaimer, the term of this patent is extended or adjusted under 35 U.S.C. 154(b) by 110 days.

(21) Appl. No.: 13/227,558

(22) Filed: Sep. 8, 2011

(65) Prior Publication Data

US 2012/0229115 A1    Sep. 13, 2012

(30) Foreign Application Priority Data

Mar. 7, 2011    (TW) .............................. 100107613 A

(51) Int. Cl.
*H03L 5/00*    (2006.01)
(52) U.S. Cl.
USPC ................................ 327/333; 327/61; 327/80
(58) Field of Classification Search
USPC ................. 326/62–63, 80–81; 327/306, 333, 327/309, 315
See application file for complete search history.

(56) References Cited

U.S. PATENT DOCUMENTS 6,246,432 B1 *   6/2001   Takami et al. .................. 348/65
7,292,016 B2 *   11/2007   Wake ............................. 323/271

* cited by examiner

*Primary Examiner* — Dinh T. Le
(74) *Attorney, Agent, or Firm* — Li & Cai Intellectual Property (USA) Office

(57) ABSTRACT

A voltage amplitude limiting circuit of a full differential circuit is provided for limiting voltage levels of a differential signal. The voltage amplitude limiting circuit includes a reference voltage generating unit and a replacing circuit. The reference voltage generating unit generates a high reference voltage and a low reference voltage. The replacing circuit is coupled to the reference voltage generating unit, a first input terminal and a second input terminal. When voltage at the first input terminal is greater than the high reference voltage, the replacing circuit uses the high reference voltage to replace the voltage at the first input terminal to serve as an output. When voltage at the first input terminal is less than the low reference voltage, the replacing circuit uses the low reference voltage to replace the voltage at the first input terminal to serve as an output.

12 Claims, 7 Drawing Sheets

US 8,525,571 B2

VOLTAGE AMPLITUDE LIMITING CIRCUIT OF FULL DIFFERENTIAL CIRCUIT

BACKGROUND

1. Technical Field

The present disclosure relates to a voltage amplitude limiting circuit in particular, to a voltage amplitude limiting circuit of full differential circuit.

2. Description of Related Art

The amplitude limiting circuit is a common type of analog circuit which can be used to limit the amplitude of an output voltage to prevent an operation voltage from exceeding the allowable voltage range of the system. The clipper circuit is a type of the amplitude limiting circuit, which is mainly used to selectively modify an output waveform and can remove the portion of the voltage waveform that have exceeded the predetermined voltage level without effecting the remaining voltage waveform.

The most commonly seen limiting circuit is consisted of resistors and non-linear components, wherein the non-linear components are for example, diodes. Diodes have the built-in forward turn-on voltage characteristic, and when the forward-biased voltage is greater than the forward turn-on voltage of the diode, the diode turns on. Placing the resistors and the diode in series, the circuit functions as a limiting circuit and can limit the voltage level of the output voltage waveform within the built-in voltage level of the diode. Wherein using a plurality of diodes in series, the size of the output voltage level limit can be adjusted.

In a voltage amplitude limiting circuit of a full differential circuit, a circuit formed by two diodes disposed in opposite directions and a differential amplifier can function as an amplitude limiting circuit. The above mentioned designed method may have the benefits of circuitry simplicity and low cost, however, the amplitude limiting levels can not be adjusted arbitrarily. Further, since diodes are non-linear electronic components and the linearity of the circuit becomes worse as the voltage level becomes closer to the forward turn-on voltage of the diodes (in series).

SUMMARY

The present disclosure is directed to a voltage amplitude limiting circuit of full differential circuit which uses the reference voltage to replace the signal waveform that has exceed the given voltage level and disposes a low-pass filter circuit at the output terminal, to reduce high frequency noises generated during the transition period of switches. In addition, the circuit is consisted of a plurality of switches and digital logic circuits, and the circuitry may be implemented using CMOS fabrication.

The present disclosure provides a voltage amplitude limiting circuit of full differential circuit for limiting a differential voltage signal received from a first input terminal and a second input terminal, including a reference voltage generating unit and a replacing circuit. The reference voltage generating unit is for generating a high reference voltage and a low reference voltage. The replacing circuit is coupled to the reference voltage generating unit, the first input terminal and the second input terminal, wherein when voltage at the first input terminal is greater than the high reference voltage, the replacing circuit uses the high reference voltage to replace the voltage at the first input terminal to serve as an output. When voltage at the first input terminal is less than the low reference voltage, the replacing circuit uses the low reference voltage to replace the voltage at the first input terminal to serve as an output. When voltage at the second input terminal is greater than the high reference voltage, the replacing circuit uses the high reference voltage to replace the voltage at the second input terminal to serve as an output; when voltage at the second input terminal is less than the low reference voltage, the replacing circuit uses the low reference voltage to replace the voltage at the second input terminal to serve as an output. If voltages at the first and the second input terminal lie between the high and the low reference voltage, then the replacing circuit is inactive and will turn on the channel switches from input terminals into the buffers. The voltage amplitude limiting circuit further includes a low-pass filter circuit which is disposed at the output terminals and may eliminate the switching glitches and noises which are generated during the transition period of the replacing circuits.

In summary, the voltage amplitude limiting circuit described in the present disclosure operates based on the voltage variations at the input terminals. When the voltage exceeds the predetermined voltage range the reference voltages are used to replace the input voltage to serve as outputs, thereby preventing the output voltage from exceeding the given voltage range. The reference voltages may be set according to the design needs instead of being limited by the built-in voltage of diodes. The internal circuitry of the voltage amplitude limiting circuit may be directly implemented using the CMOS fabrications, as the circuitry area is small and the design cost is quite low.

In order to further understand the techniques, means and effects the present disclosure, the following detailed descriptions and appended drawings are hereby referred, such that, through which, the purposes, features and aspects of the present disclosure can be thoroughly and concretely appreciated; however, the appended drawings are merely provided for reference and illustration, without any intention to be used for limiting the present disclosure.

BRIEF DESCRIPTION OF THE DRAWINGS

The accompanying drawings are included to provide a further understanding of the present disclosure, and are incorporated in and constitute a part of this specification. The drawings illustrate exemplary embodiments of the present disclosure and, together with the description, serve to explain the principles of the present disclosure.

DESCRIPTION OF THE EXEMPLARY EMBODIMENTS

Figure 1:
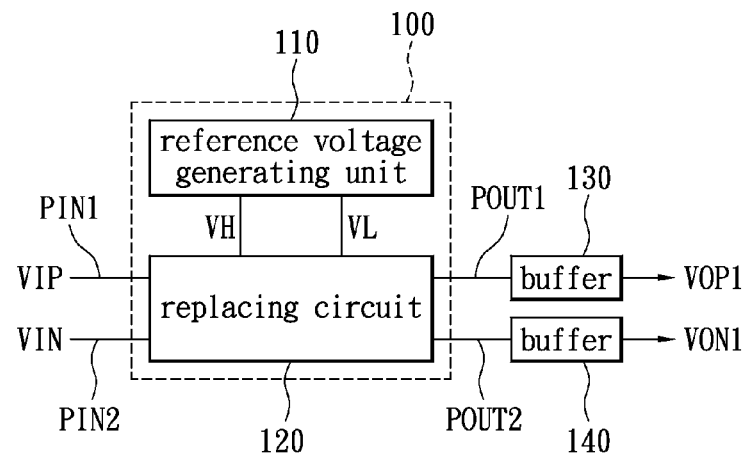
FIG. 1 shows a function block diagram of a voltage amplitude limiting circuit of full differential for the first exemplary embodiment of the present disclosure.

Reference will now be made in detail to the exemplary embodiments of the present disclosure, examples of which are illustrated in the accompanying drawings. Wherever possible, the same reference numbers are used in the drawings and the description to refer to the same or like parts.

First Embodiment

FIG. 1 shows a function block diagram of a voltage amplitude limiting circuit of full differential circuit for the first exemplary embodiment of the present disclosure. The voltage amplitude limiting circuit 100 includes a reference voltage generating unit 110 and a replacing circuit 120. The reference voltage generating unit 110 outputs a high reference voltage VH and a low reference voltage VL to the replacing circuit 120. The replacing circuit 120 is coupled to the first input terminal PIN1 and the second input terminal PIN2, and receives a differential voltage signal from the first input terminal PIN1 and the second input terminal PIN2. The voltage at the first input terminal PIN1 is denoted as VIP and the voltage at the second input terminal PIN2 is denoted as VIN, wherein the voltage difference between the voltage VIP and the voltage VIN is the inputted differential voltage signal. The replacing circuit 120 has a first output terminal POUT1 and a second output terminal POUT2 for outputting the differential signal and voltages VOP, VON of these two output terminals form a differential voltage signal at the output terminals, which through buffers 130, 140 outputs to the next stage of the circuit.

The replacing circuit 120 may replace the voltage VIP and the voltage VIN with the high reference voltage and the low reference voltage selectively according to the voltage levels of the voltage VIP and the voltage VIN, and outputs the high reference voltage VH and the low reference voltage VL to the first output terminal POUT1 and the second output terminal POUT2. In the first exemplary embodiment, the high reference voltage VH is greater than the low reference voltage VL, and the voltage range formed by these two voltages is used to limit the voltage outputted to the first output terminal POUT1 and the second output terminal POUT2. For instance, when the replacing circuit 120 detects that the voltage VIP is greater than the high reference voltage VH, the replacing circuit 120 will use the high reference voltage VH to replace the voltage VIP and output the high reference voltage VH at the first output terminal POUT1 of the replacing circuit 120; when the voltage VIP is less than the low reference voltage VL, the replacing circuit 120 will use the low reference voltage VL to replace the voltage VIP and output the low reference voltage VL at the first output terminal POUT1 of the replacing circuit 120. When the voltage VIP lies between the high reference voltage VH and the low reference voltage VL, the replacing circuit 120 will directly output the voltage VIP to the first output terminal POUT1 to serve as an output voltage VOP. In other words, if the input voltage VIP lies between the high reference voltage VH and the low reference voltage VL, then the replacing circuit 120 is inactive and will directly conduct the input to buffers 130, 140.

Similarly, when the replacing circuit 120 detects the voltage VIN is greater than the high reference voltage VH, the replacing circuit 120 will use the high reference voltage VH to replace the voltage VIN and output the high reference voltage VH at the second output terminal POUT2 of the replacing circuit 120; when the voltage VIN is less than the low reference voltage VL, the replacing circuit 120 will use the low reference voltage VL to replace the voltage VIN and output the low reference voltage VL at the second output terminal POUT2 of the replacing circuit 120. When voltage VIN lies between the high reference voltage VH and the low reference voltage VL, the replacing circuit 120 will directly output voltage VIP to the second output terminal POUT2 to serve as an output voltage VON. If the input voltage VIN lies between the high reference voltage VH and the low reference voltage VL, then the replacing circuit 120 is inactive and will directly conduct the input to buffers 130, 140.

Figure 2:
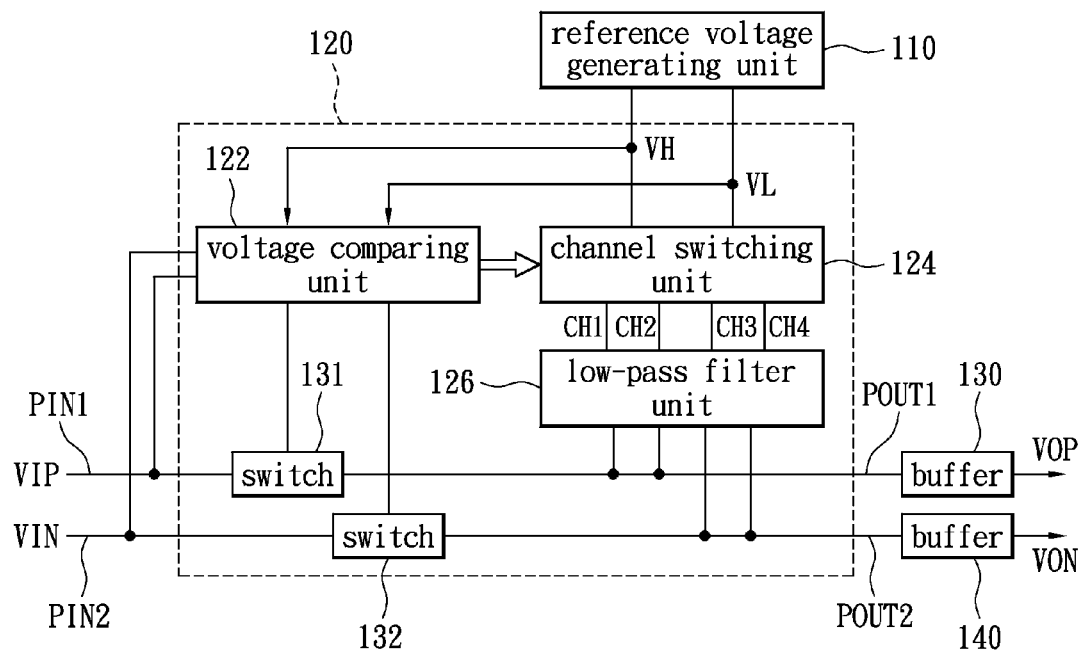
FIG. 2 shows a function block diagram of the replacing circuit 120 for the first exemplary embodiment of the present disclosure.

The internal circuitry of the replacing circuit 120 is illustrated in FIG. 2, which shows the function block diagram of the replacing circuit 120 for the first exemplary embodiment of the instant disclosure. The replacing circuit 120 includes a voltage comparing unit 122, a channel switching unit 124, a low-pass filter unit 126, and switches 131, 132. Switches 131, 132 are voltage-controlled switches and may be turned on or off according to the output of the voltage comparing unit 122. The voltage comparing unit 122 is coupled to the output of the reference voltage generating unit 110, the first input terminal PIN1 and the second input terminal PIN2, to compare voltages VIP, VIN with the high reference voltage VH and the low reference voltage VL. Then the switches 131, 132, and the channel switching unit 124 are controlled according to the comparison result. The channel switching unit 124, coupled between the reference voltage generating unit 110 and the low-pass filter unit 126, has four channels CH1~CH4 and may deliver the high reference voltage VH and the low reference voltage VL to the first output terminal POUT1 and the second output terminal POUT2, respectively. For instance, channels CH1 and CH3 correspond to the high reference voltage VH and may provide the high reference voltage VH to the first output terminal POUT1 or the second output terminal POUT2. Channels CH2 and CH4 correspond to the low reference voltage VL and may provide the low reference voltage VL to the first output terminal POUT1 or the second output terminal POUT2. The correspondences among channels CH1~CH4 and the high reference voltage VH, the low reference voltage VL are not limited, mainly since the high reference voltage VH and the low reference voltage VL may be delivered to the first output terminal POUT1 and the second output terminal POUT2 according to the comparison results.

When the voltage comparing unit 122 detects the voltage VIP or VIN exceeds the voltage range formed by the high reference voltage VH and the low reference voltage VL, the voltage comparing unit 122 turns off the corresponding switches 131, 132 while controls the channel switching unit 124 to conduct corresponding channels CH1~CH4 (one or two of the channels), to replace the exceeded voltage VIP or VIN to serve as an output or outputs. If inputted voltages VIP, VIN lie between the high reference voltage VH and the low reference voltage VL, then channels CH1~CH4 are turned off. At this time, switches 131, 132 would be turned on, which means that the inputted voltages VIP, VIN are outputted directly to buffers 130, 140 and will not be limited in the amplitude. By this operation, voltages VOP, VON at the first output terminal POUT1 and the second output terminal POUT2 will not exceed the predetermined voltage range, thus achieves the effect of limiting the voltage level. The low-pass filter unit 126, coupled between the channel switching unit 124 and the output terminals (POUT1, POUT2), may be used to filter the high frequency noises in CH1~CH4 and to reduce the bounce noises generated during the transition period of switches 131, 132. Since the voltage comparing unit 122 does not contain non-linear components, thus the voltage comparing unit 122 may use the same CMOS fabrication for the entire circuitry implementation, thereby reducing the circuitry area and fabrication cost. In addition, the limit of the output voltage level may be set from the high reference voltage VH and the low reference voltage VL, not bounded by the multiples of the forward turn-on voltage of the diodes.

Figure 3A:
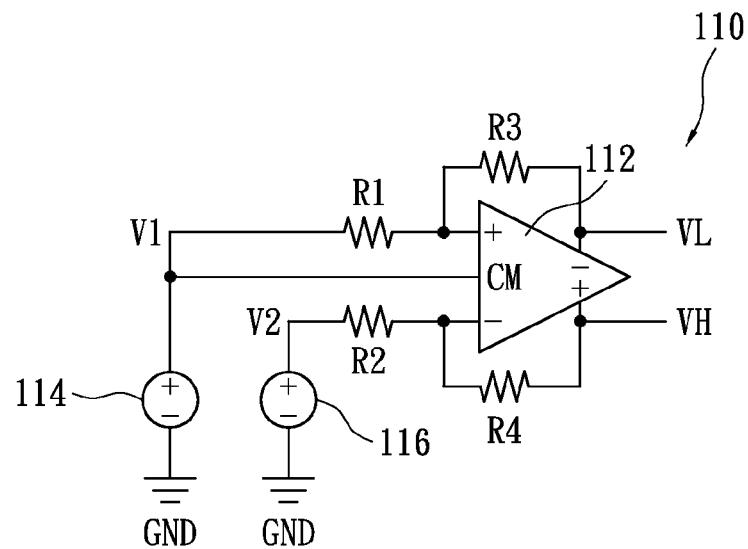
FIG. 3A shows an internal schematic diagram of the reference voltage generating unit 110 for the first exemplary embodiment of the present disclosure.
Figure 3B:
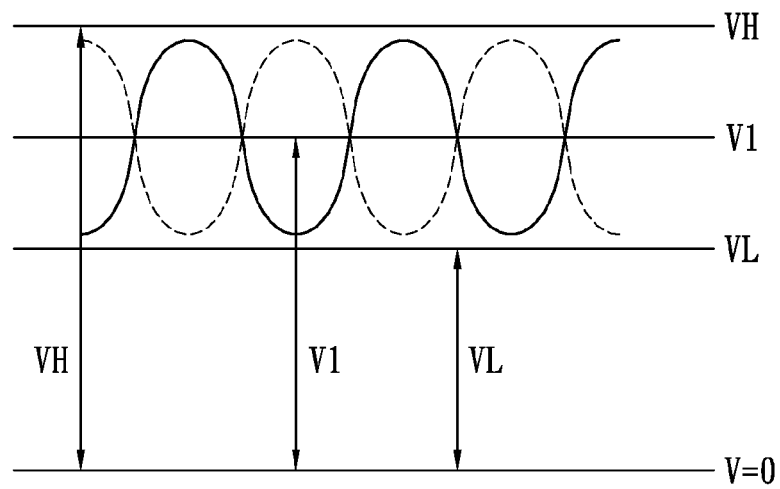
FIG. 3B shows an output waveform of the reference voltage generating unit 110 for the first exemplary embodiment of the present disclosure.

Next, detail elaborations on the circuitry implementation for each unit contained in the voltage amplitude limiting circuit 100 are further described as follows, please refer to FIG. 3A and FIG. 3B, which show the internal circuitry and an output waveform respectively for the reference voltage generating unit 110 in the first exemplary embodiment of the instant disclosure. Please refer to FIG. 3A, the reference voltage generating unit 110 includes the full differential operational amplifier 112, voltage sources 114, 116, and resistors R1~R4. The positive input terminal of the full differential operational amplifier 112 is coupled to the voltage source 114 through the resistor R1, the common-mode voltage terminal CM is coupled to the voltage source 114, and the negative input terminal is coupled to the voltage source 116 though the resistor R2. The resistor R3 is coupled between the positive input terminal and the negative output terminal of the full differential operational amplifier 112 and the resistor R4 is coupled between the negative input terminal and the positive output terminal of the full differential operational amplifier 112. The output voltage of the voltage source 114 is V1 and the output voltage of the voltage source 116 is V2. The positive and negative output terminal of the full differential operational amplifier 112 may generate the high reference voltage VH and the low reference voltage VL. As shown in FIG. 3B, the median voltage value between the high reference voltage VH and the low reference voltage VL is V1, wherein the voltages of both the high reference voltage VH and the low reference voltage VL may be determined by the voltage V2 and resistors R1-R4. Based on the explanation of the aforementioned embodiment, those skilled in the art should be able to deduce the other embodiments according to the disclosure of the present invention, and the description is thereby omitted.

Figure 4:
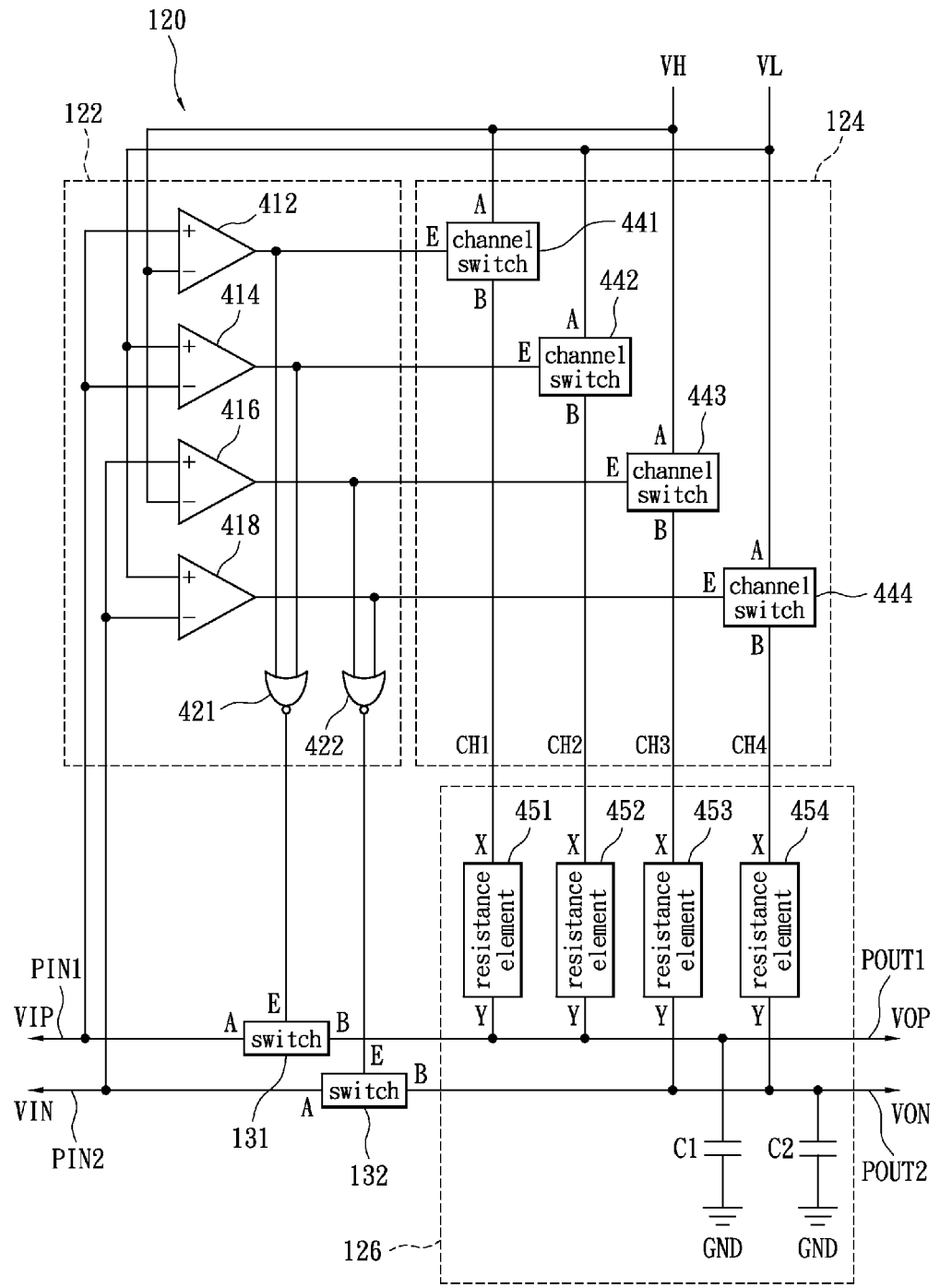
FIG. 4 shows an internal schematic diagram of the replacing circuit 120 for the first exemplary embodiment of the present disclosure.

Please refer to FIG. 4, which diagrams the internal circuitry of the replacing circuit 120 for the first exemplary embodiment of the present disclosure. The voltage comparing unit 122 includes comparators 412~418 and two NOR gates 421, 422. The channel switching unit 124 includes four channel switches 441~444 to form four channels CH1~CH4. The low-pass filter unit 126 includes four resistance elements 451~454 and two capacitors C1, C2, wherein each of the resistance elements 451~454 has very high resistance. The positive input terminal of the comparator 412 is coupled to the first input terminal PIN1, the negative input terminal is coupled to the high reference voltage VH, and the output terminal is coupled to the input terminal of the NOR gate 421. The comparator 414 has a positive input terminal coupled to the low reference voltage VL and a negative input terminal coupled to the first input terminal PIN1 and an output terminal coupled to the input terminal of the NOR gate 421. The comparator 416 has a positive input terminal coupled to the second input terminal PIN2, a negative input terminal coupled to the high reference voltage VH and an output terminal coupled to the input terminal of the NOR gate 422. The comparator 418 has a positive input terminal coupled to the low reference voltage VL, a negative input terminal coupled to the second input terminal PIN2 and an output terminal coupled to the input terminal of the NOR gate 422. The output terminal of the NOR gate 421 is coupled to the switch 131 and the output terminal of the NOR gate 422 is coupled to the switch 132.

In other words, the comparator 412 is for comparing the voltage VIP of the first input terminal PIN1 with the high reference voltage VH; the comparator 414 is for comparing the voltage VIP of the first input terminal PIN1 with the low reference voltage VL; the comparator 416 is for comparing the voltage VIN of the second input terminal PIN2 with the high reference voltage VH; the comparator 418 is for comparing the voltage VIN of the second input terminal PIN2 with the low reference voltage VL. When the enable terminal E of the switch 131 receives a positive voltage, the terminal A and the terminal B conducts; when the enable terminal E receives a logic low voltage, the terminal A and the terminal B opens. The operation of switch 132 is essentially the same as switch 131, and the detail descriptions are thereby omitted.

The channel switch 441 is coupled between the high reference voltage VH and the resistance element 451 and is controlled by the output of the comparator 412. The channel switch 442 is coupled between the low reference voltage VL and the resistance element 452 and is controlled by the output of the comparator 414. The channel switch 443 is coupled between the high reference voltage VH and the resistance element 453 and is controlled by the output of the comparator 416. The channel switch 444 is coupled between the low reference voltage VL and the resistance element 454 and is controlled by the output of the comparator 418. Channel switches 441~444 and switches 131, 132 are all voltage-controlled switches and may all be implemented using the same circuitry structure, thus detail descriptions are thereby omitted.

The capacitor C1 is coupled between the first output terminal POUT1 and the ground terminal GND. The capacitor C2 is coupled between the second output terminal POUT2 and the ground terminal GND. Capacitors C1, C2 and the resistance elements 451~454 may form a low-pass filter to eliminate the high frequency noises in channels of CH1~CH4 and to reduce the noises generated during the transition period of channel switches 441~441. Moreover, capacitors C1, C2 also have effects on suppressing noises generated during the transition period of switches 131, 132.

During the operation, when the voltage VIP is greater than the high reference voltage VH, the switch 131 turns off and the channel switch 441 conducts to output the high reference voltage VH to the first output terminal POUT1. When the voltage VIP is less than the low reference voltage VL, the switch 131 turns off and the channels switch 442 conducts to output the low reference voltage VL to the first output terminal POUT1. Similarly, when the voltage VIN is greater than the high reference the voltage VH, the switch 132 turns off and the channel switch 443 conducts to output the high reference voltage VH to the second output terminal POUT2. When the voltage VIN is less than the low reference voltage VL, the switch 132 turns off and the channel switch 444 conducts to output the low reference voltage VL to the second output terminal POUT2. Thereby, the outputted voltage from the first output terminal POUT1 and the second output terminal POUT2 may be restricted between the high reference voltage VH and the low reference voltage VL to prevent the output voltage from exceeding the operating voltage range of the back-end circuit. The low-pass filter unit 126 may reduce the high frequency noises generated during the transition period of switches 131, 132 and channel switches 441~444.

Figure 5A:
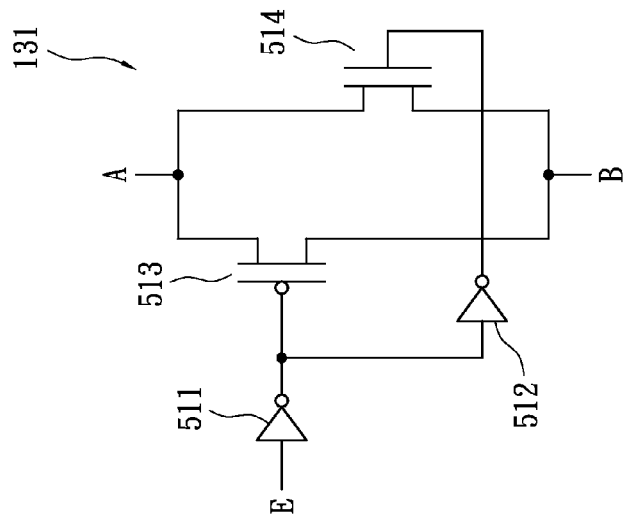
FIG. 5A shows a schematic diagram of a voltage-controlled switch for the first exemplary embodiment of the present disclosure.
Figure 5B:
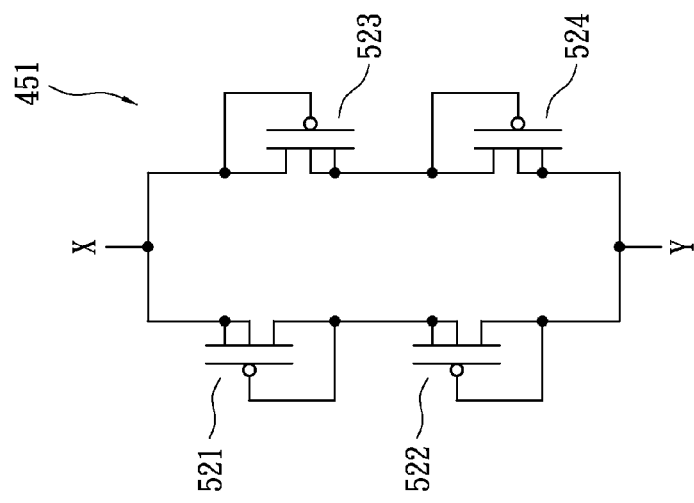
FIG. 5B shows a schematic diagram of a resistance element for the first exemplary embodiment of the present disclosure.

Switches 131,132 and channel switches 441~442 are voltage-controlled switches, the implementation methods thereof are shown in FIG. 5A, which illustrates the circuitry of a voltage-controlled switches for the first exemplary embodiment of the instant disclosure. Taking switch 131 as an example, switch 131 includes a PMOS transistor 513, an NMOS transistor 514, and inverters 511, 512. The PMOS transistor 513 and the NMOS transistor 514 are coupled in parallel to the terminal A and the terminal B. The inverter 511 has an input terminal coupled to the enable terminal E and an output terminal coupled to the gate of the PMOS transistor 513. The inverter 512 is coupled between the output of the inverter 511 and the gate of the NMOS transistor 514. The resistance elements 451-454 may be implemented using transistors as shown in FIG. 5B, which shows a circuitry structure of a resistance element for the first exemplary embodiment of the instant disclosure. Taking resistance element 451 as an example, the resistance element 451 includes four PMOS transistors 521-524, the associated coupling relationship is as shown in FIG. 5B, forming four diode-connected structures to serve as a very high resistance resistor. Since the circuitry structure constructed by these four PMOS transistors 521-524 may formed a very high resistance element of magnitude of 10E9. As the resistance of this type structure of circuitry is very large, thus the value of capacitors C1, C2 only need to be in the pico-farad range to form the low-pass filter unit with 3 dB frequency less than 100 Hz, almost only the DC voltage can pass through.

Figure 5C:
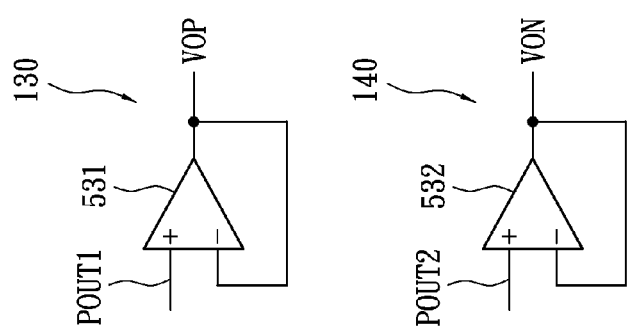
FIG. 5C shows a schematic diagram of a buffer for the first exemplary embodiment of the present disclosure.

Buffers 130, 140 may be implemented using unit-gain amplifiers, as the prior stage of circuit employs very high resistance type of filter device, placing the limitation on the usage of buffers that it must fulfill very high input resistance requirement to avoid signal great attenuation. As shown in FIG. 5C, which illustrates the circuitry of a buffer for the first exemplary embodiment of the instant disclosure. The buffer 130 is implemented using the operational amplifier 531 with negative feedback and the buffer 140 is implemented using the operation amplifier 532 with negative feedback. The aforementioned circuitry implementations of every circuit device or components are only one of exemplary implementations of the present disclosure and the implementation methodologies thereof are not limited in the instant disclosure. From the explanation of the aforementioned embodiment, those skilled in the art should be able to deduce the other embodiments according to the disclosure of the present invention, and the description is thereby omitted.

Figure 6A:
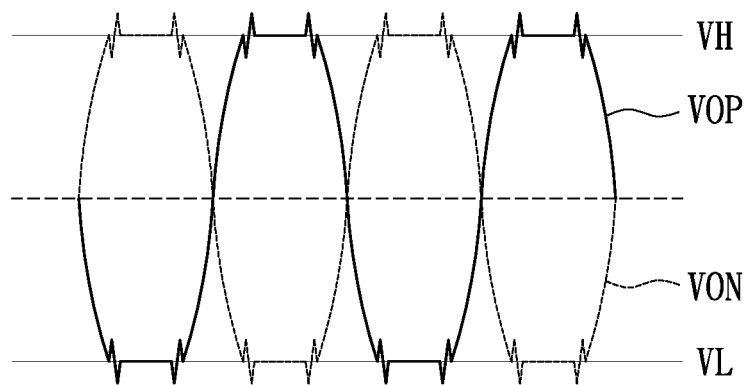
FIG. 6A shows an output waveform of the circuit without the placement of a low-pass filter.
Figure 6B:
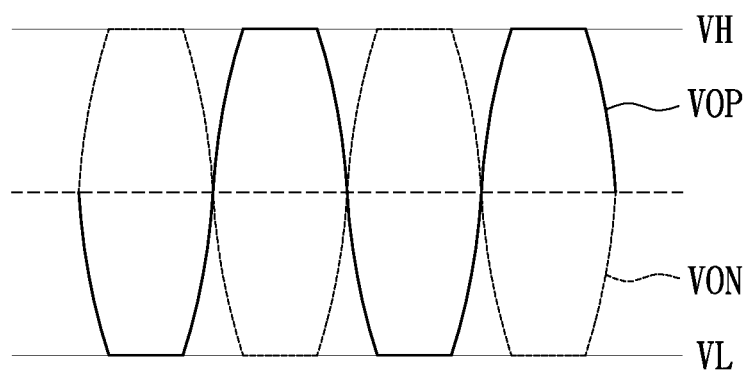
FIG. 6B shows an output waveform for the first exemplary embodiment of the present disclosure.

FIG. 6A and FIG. 6B shows exemplary waveforms of the voltage VOP and the voltage VON, wherein FIG. 6A describes the output waveform without disposing a low-pass filter unit 126 and FIG. 6B describes the output waveform for the first exemplary embodiment of the instant disclosure. As shown in FIG. 6A without the presence of low-pass filter unit 126, the output waveform will have spikes or glitches generated due to the transition of switches. When the low-pass filter unit 126 is disposed, spikes or glitches will then be eliminated.

Second Embodiment

Figure 7:
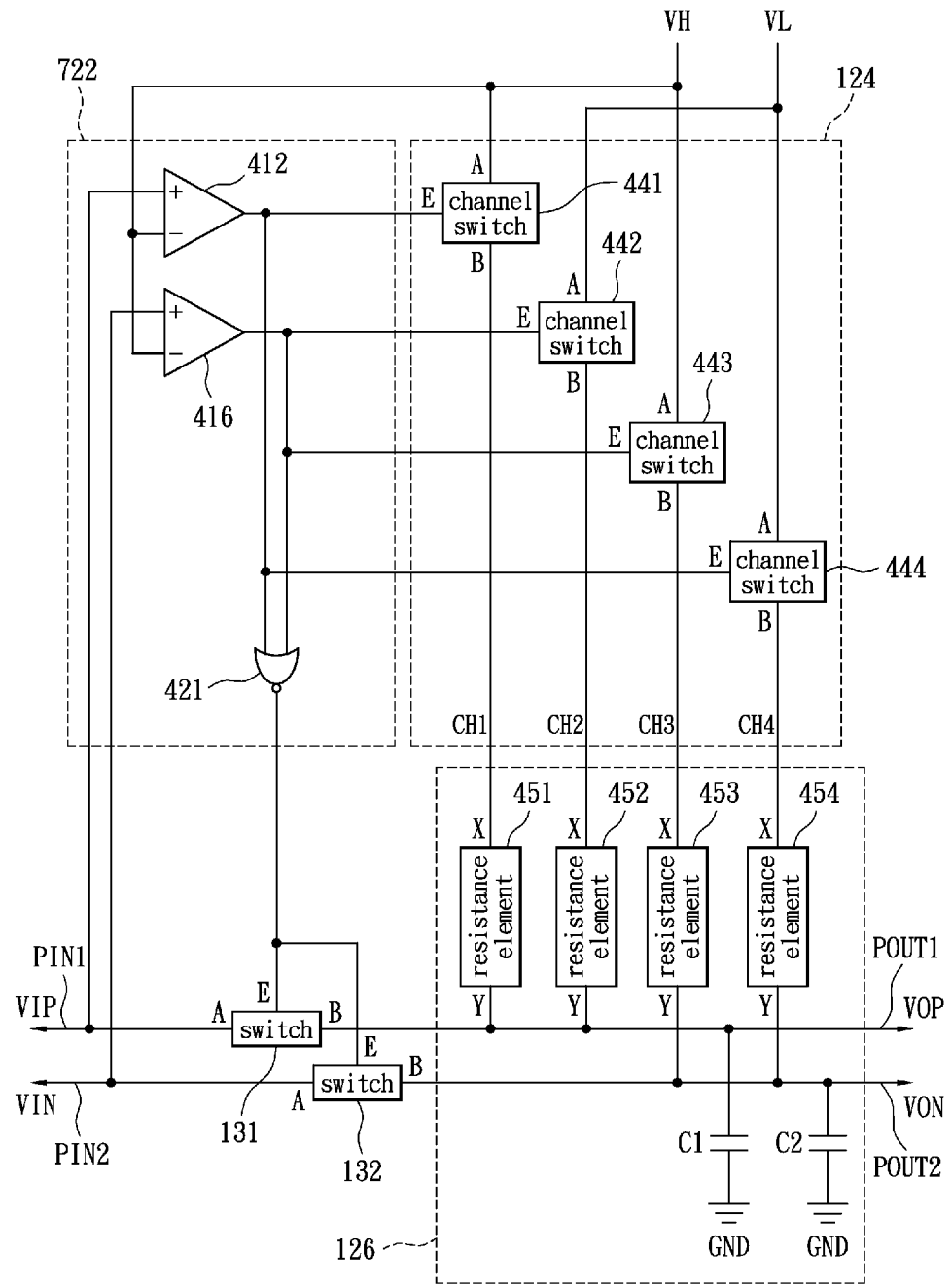
FIG. 7 shows a schematic diagram of a replacing circuit for the second exemplary embodiment of the present disclosure.

The above mentioned replacing circuit 120 of FIG. 4 may be implemented using different implementations. Please refer to FIG. 7, which shows the circuitry of the replacing circuit for the second exemplary embodiment of the instant disclosure. The main difference between FIG. 7 and FIG. 4 is on the voltage comparing unit 722, the voltage comparing unit 722 includes comparators 412, 416 and a NOR gate 421. The coupling relationships of comparators 412, 416 are as previously described for FIG. 4, hence the detail descriptions are thereby omitted. The enable terminals E of both the switch 131 and the switch 132 are coupled to the output of the NOR gate 421. Since the voltages VIP and VIN forms a differential signal, therefore the voltages VIP and VIN are symmetrical in the upper and lower amplitude with 180 degree phase shift, hence the voltage comparing unit 722 only uses the high reference voltage VH to compare with the voltages VIP and VIN. When find that either one of voltages VIP, VIN is greater than the high reference voltage VH, the voltage comparing unit 722 turns off switches 131, 132 and conducts the correspond at least two of channels 441-444 to let the high reference voltage VH and low reference voltage VL replace voltages VIP and VIN to serve as outputs to the first output terminal POUT1 and the second output terminal POUT2, respectively.

The channel switching unit 124 will determine which of the channel switches 441-444 to be turned on, according to the output of comparators 412, 416. When to the comparator 412 outputs a positive voltage, channel switches 441, 441 turn on. The conducted channel switches 441, 444 will have the high reference voltage VH outputted to the first output terminal POUT1, and have the low reference voltage VL outputted to the second output terminal POUT2. On the other hand, when the comparator 416 outputs positive voltage, channel switches 442, 443 will turn on to have the high reference voltage VH outputted to the second output terminal POUT2 and to have the low reference voltage VL outputted to the first output terminal POUT1. When switches 131, 132 turn on indicate that the inputs to NOR gates 421, 422 are logic 0, switches 441~444 are all turned off meaning that the input voltages VIP and VIN lie between the high reference voltage VH and the low reference voltage VL, at this moment, no need to limit the amplitude. Since the voltage comparing unit 722 employs less circuit components, thus could reduce the area of circuitry and design cost. The descriptions on the implementation methodology for the rest of the circuitry are essentially the same as the ones described in FIG. 1, hence the detail descriptions are thereby omitted.

Third Embodiment

Figure 8:
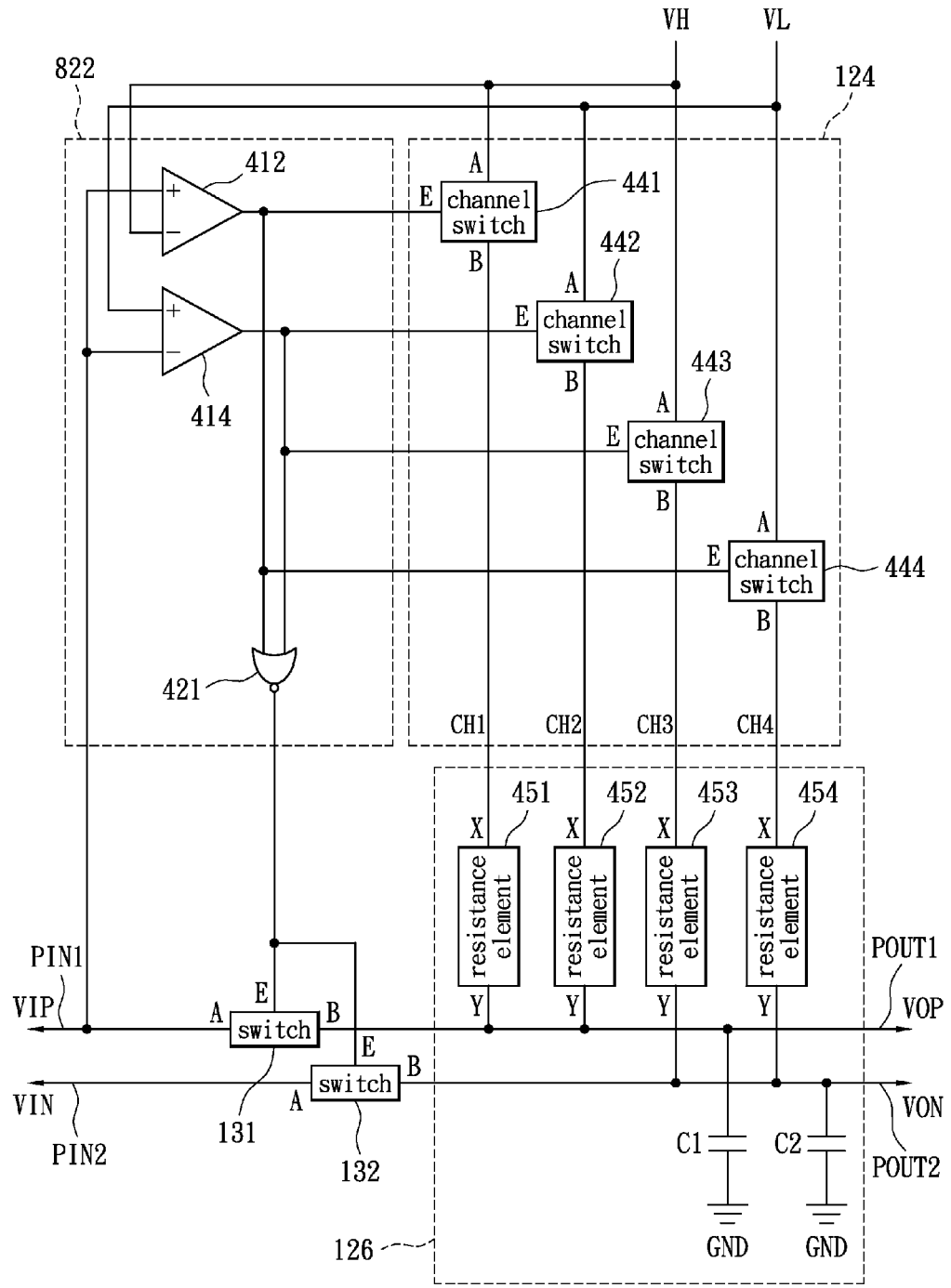
FIG. 8 shows a schematic diagram of a replacing circuit for the third exemplary embodiment of the present disclosure.

Similarly, utilizing the symmetry characteristics of the differential signal in the upper and the lower amplitude and 180 degree phase shift, the replacing circuit 120 also may just detect the voltage VIP as shown in FIG. 8, which shows the circuitry of the replacing circuit for the third exemplary embodiment of the instant disclosure. The main difference between FIG. 8 and FIG. 4 is on the voltage comparing unit 822 which includes the comparator 412 and the comparator 414. These two comparators 412, 414 are mainly used for detecting whether or not the voltage VIP exceeds the voltage range form by the high reference voltage VH and the low reference voltage VL. When the voltage VIP is greater than the high reference voltage VH, the voltage comparing unit 822 turns off switches 131, 132 and turns on channel switches 441, 444 to have the high reference voltage VH outputted to the first output terminal POUT1 and to have the low reference voltage VL outputted to the second output terminal POUT2. When the voltage VIP is less than the low reference voltage VL, the voltage comparing unit 822 turns off switches 131, 132 and turns on channel switches 442, 443 to have the high reference voltage VH outputted to the second output terminal POUT2, and to have the low reference voltage VL outputted to the first output terminal POUT1. The rest of circuitry details shown in FIG. 8 are essentially the same as the ones described in FIG. 4, those skilled in the art should be able to deduce the other embodiments according to the disclosure of the present invention, and the details descriptions are thereby omitted.

In addition, using the same method, since voltages VIP, VIN are fully differential signals, thus the replacing circuit 120 may just compare the one of the voltages VIP, VIN, or just uses the high reference voltage VH or the low reference voltage VL to compare with voltages VIP, VIN to determine whether or not voltages VIP, VIN exceed the predetermined range. Based on the explanation of the aforementioned embodiment, those skilled in the art should be able to deduce the other embodiments according to the present disclosure, and the detail descriptions are thereby omitted. The above described implementation methodologies of the switch 131, channel switches 441~444, and the resistance elements 451-454 are not limited by the circuitry described in FIG. 5A~FIG. 5C. The voltage comparing unit 122 is mainly used for monitoring whether or not the received voltages VIP, VIN exceed the predetermined range, wherein the associated circuitry is not limited to the aforementioned comparators 412-418 in FIG. 4. Based on the explanation of the aforementioned embodiment, those skilled in the art should be able to deduce the other embodiments according to the disclosure of the present invention, and the detail descriptions are thereby omitted.

Furthermore, it is noteworthy that the coupling connections among the aforementioned components includes both direct or indirect electrical connections and the scope of the present disclosure does not limit the types of connection employed as long as the type of connection employed is able to fulfill the electrical signal transmission functionality. The techniques described in the aforementioned embodiments may be combined or used independently, further the associated components may add, delete, modify or replace accord to the needs of both design and functional requirements and the present invention are not limited thereto. From the explanation of the aforementioned embodiment, those skilled in the art should be able to deduce the other embodiments according to the disclosure of the present invention, and the description is omitted.

In summary, the instant disclosure utilizes two adjustable reference voltages to replace the input voltages that have exceeded the operation voltage range, and the operating voltage range maybe adjusted according to the needs. In addition, disposing a low-pass filter unit at the output terminal of the instant disclosure may reduce the noises generated during the transition period of switches. The circuitry of the instant disclosure includes a plurality of transistors and digital circuit components and may be implemented using CMOS fabrication, as the circuitry area is smaller and the cost is lower.

The above-mentioned descriptions represent merely the exemplary embodiment of the present disclosure, without any intention to limit the scope of the present disclosure thereto. Various equivalent changes, alternations or modifications based on the claims of present disclosure are all consequently viewed as being embraced by the scope of the present disclosure.

What is claimed is:

1. A voltage amplitude limiting circuit of a full differential circuit for limiting a differential voltage signal received from a first input terminal and a second input terminal, comprising:
    a reference voltage generating unit for generating a high reference voltage and a low reference voltage level; and
    a replacing circuit coupled to the reference voltage generating unit, the first input terminal and the second input terminal, wherein when voltage at the first input terminal is greater than the high reference voltage, the replacing circuit uses the high reference voltage to replace the voltage at the first input terminal, and outputs the high reference voltage at a first output terminal of the replacing circuit; when voltage at the first input terminal is less than the low reference voltage, the replacing circuit uses the low reference voltage to replace the voltage at the first input terminal, and outputs the low reference voltage at the first output terminal of the replacing circuit.

2. The voltage amplitude limiting circuit according to claim 1, wherein when voltage at the second input terminal is greater than the high reference voltage, the replacing circuit uses the high reference voltage to replace the voltage at the second input terminal, and outputs the high reference voltage at a second output terminal of the replacing circuit; when voltage at the second input terminal is less than the low reference voltage, the replacing circuit uses the low reference voltage to replace the voltage at the second input terminal, and outputs the low reference voltage at the second output terminal of the replacing circuit.

3. The voltage amplitude limiting circuit according to claim 2, wherein the replacing circuit comprises:
    a first switch coupled between the first input terminal and the first output terminal;
    a second switch coupled between the second input terminal and the second output terminal;
    a voltage comparing unit coupled to the first switch, the second switch and the reference voltage generator unit for determining whether or not the differential voltage signal lies between the high reference voltage and the low reference voltage and controls the first switch and the second switch accordingly; and
    a channel switching unit coupled to the reference voltage generating unit, the voltage comparing unit, the first output terminal and the second output terminal for selectively providing the high reference voltage and the low reference voltage to the first output terminal and the second output terminal according to a comparison result of the voltage comparing unit.

4. The voltage amplitude limiting circuit according to claim 3, wherein the replacing circuit further comprises:
    a low-pass filter unit coupled to the outputs of the channel switching unit, the first output terminal and the second output terminal.

5. The voltage amplitude limiting circuit according to claim 4, wherein the low-pass filter unit comprises:
    a first resistance element coupled between a first channel of the channel switching unit and the first output terminal;
    a second resistance element coupled between a second channel of the channel switching unit and the first output terminal;
    a third resistance element coupled between a third channel of the channel switching unit and the second output terminal;
    a fourth resistance element coupled between a fourth channel of the channel switching unit and the second output terminal;
    a first capacitor coupled between the first output terminal and a ground terminal; and a second capacitor coupled between the second output terminal and the ground terminal.

6. The voltage amplitude limiting circuit according to claim 3, wherein the voltage comparing unit comprises:
    a first comparator for comparing the voltage of the first input terminal with the high reference voltage;

a second comparator for comparing the voltage of the first input terminal with the low reference voltage;

a third comparator for comparing the voltage of the second input terminal with the high reference voltage;

a fourth comparator for comparing the voltage of the second input terminal with the low reference voltage;

a first NOR gate having input terminals coupled to the output terminal of the first comparator and the output terminal of the second comparator respectively and an output terminal coupled to the first switch; and a second NOR gate having input terminals coupled to the output terminal of the third comparator and the output terminal of the fourth comparator respectively and an output terminal coupled to the second switch.

7. The voltage amplitude limiting circuit according to claim 6, wherein the channel switching unit comprises:

a first channel switch coupled between the high reference voltage and the first output terminal and being controlled by the output of the first comparator;

a second channel switch coupled between the low reference voltage and the first output terminal and being controlled by the output of the second comparator;

a third channel switch coupled between the high reference voltage and the second output terminal and being controlled by the output of the third comparator; and a fourth channel switch coupled between the low reference voltage and the second output terminal and being controlled by the output of the fourth comparator.

8. The voltage amplitude limiting circuit according to claim 3, wherein the voltage comparing unit comprises:

a first comparator for comparing the voltage of the first input terminal with the high reference voltage;

a second comparator for comparing the voltage of the first input terminal with low reference voltage; and a first NOR gate having input terminals coupled to the output terminal of the first comparator and the output terminal of the second comparator respectively and an output terminal coupled to the first switch and the second switch.

9. The voltage amplitude limiting circuit according to claim 8, wherein the channel switching unit comprises:

a first channel switch coupled between the high reference voltage and the first output terminal and being controlled by the output of the first comparator;

a second channel switch coupled between the low reference voltage and the first output terminal and being controlled by the output of the second comparator;

a third channel switch coupled between the high reference voltage and the second output terminal and being controlled by the output of the second comparator; and a fourth channel switch coupled between the low reference voltage and the second output terminal and being controlled by the output of the first comparator.

10. The voltage amplitude limiting circuit according to claim 3, wherein the voltage comparing unit comprises:

a first comparator for comparing the voltage of the first input terminal with the high reference voltage;

a second comparator for comparing the voltage of the second input terminal with the high reference voltage; and a first NOR gate having input terminals coupled to the output terminal of the first comparator and the output terminal of the second comparator respectively and an output terminal coupled to the first switch and the second switch.

11. The voltage amplitude limiting circuit according to claim 10, wherein the channel switching unit comprises:

a first channel switch coupled between the high reference voltage and the first output terminal and being controlled by the output of the first comparator;

a second channel switch coupled between the low reference voltage and the first output terminal and being controlled by the output of the second comparator;

a third channel switch coupled between the high reference voltage and the second output terminal and being controlled by the output of the second comparator; and a fourth channel switch coupled between the low reference voltage and the second output terminal and being controlled by the output of the first comparator.

12. The voltage amplitude limiting circuit according to claim 3 further comprises:

a first buffer coupled to the first output terminal; and a second buffer coupled to the second output terminal.

* * * * *